United States Patent
Chisaka

(10) Patent No.: US 9,408,310 B2
(45) Date of Patent: Aug. 2, 2016

(54) SUBSTRATE WITH BUILT-IN COMPONENT AND METHOD FOR MANUFACTURING THE SAME

(71) Applicant: Murata Manufacturing Co., Ltd., Nagaokakyo-shi, Kyoto-fu (JP)

(72) Inventor: Shunsuke Chisaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 481 days.

(21) Appl. No.: 13/857,167

(22) Filed: Apr. 5, 2013

(65) Prior Publication Data

US 2013/0213699 A1 Aug. 22, 2013

Related U.S. Application Data

(63) Continuation of application No. PCT/JP2011/073176, filed on Oct. 7, 2011.

(30) Foreign Application Priority Data

Oct. 8, 2010 (JP) ................................ 2010-228270

(51) Int. Cl.
| | |
|---|---|
| H05K 1/03 | (2006.01) |
| H05K 1/18 | (2006.01) |
| H05K 3/32 | (2006.01) |
| H05K 3/46 | (2006.01) |
| H05K 3/40 | (2006.01) |

(52) U.S. Cl.
CPC ............... *H05K 1/185* (2013.01); *H05K 1/182* (2013.01); *H05K 1/186* (2013.01); *H05K 3/32* (2013.01); *H05K 3/4632* (2013.01); *H05K 3/4069* (2013.01); *H05K 3/4617* (2013.01); *H05K 2201/09527* (2013.01); *H05K 2201/09781* (2013.01); *H05K 2203/063* (2013.01); *Y10T 29/49139* (2015.01)

(58) Field of Classification Search
CPC ..... H05K 1/185; H05K 1/186; H05K 3/4632; H05K 3/32; H05K 1/182; H05K 3/4617; H05K 2201/09781; H05K 2203/063; H05K 3/4069; H05K 2201/09527; Y10T 29/49139
USPC ........................................................ 174/255
See application file for complete search history.

(56) References Cited

U.S. PATENT DOCUMENTS

2007/0263369 A1    11/2007    Takeuchi et al.
2008/0136013 A1     6/2008    Kamiya et al.

FOREIGN PATENT DOCUMENTS

| JP | 2007-305674 A | 11/2007 |
|---|---|---|
| JP | 2008-147254 A | 6/2008 |
| JP | 2008-186986 A | 8/2008 |
| JP | 2008-186987 A | 8/2008 |

OTHER PUBLICATIONS

Official Communication issued in International Patent Application No. PCT/JP2011/073176, mailed on Jan. 10, 2012.
Official Communication issued in corresponding Japanese Patent Application No. 2012-537768, mailed on Apr. 24, 2013.

*Primary Examiner* — Tremesha S Willis
(74) *Attorney, Agent, or Firm* — Keating & Bennett, LLP

(57) ABSTRACT

A substrate includes a built-in component that suppresses resin flow occurring in the case of thermocompression bonding in a region where vias and wiring conductors are provided and that reduces the occurrence of via defects and wiring-conductor defects. The resin flow occurring in an outer side portion of a frame-shaped electrode is suppressed in the case of thermocompression bonding by encircling the periphery of a built-in component with the frame-shaped electrode. Because of this structure, the occurrence of defects in vias and wiring conductors arranged in an outer side portion of the frame-shaped electrode may be reduced.

8 Claims, 8 Drawing Sheets

20

30

40

SUBSTRATE WITH BUILT-IN COMPONENT AND METHOD FOR MANUFACTURING THE SAME

BACKGROUND OF THE INVENTION

1. Field of the Invention

The present invention relates to a substrate with a built-in component, an electronic component being built in the substrate with a built-in component, and a method for manufacturing the same.

2. Description of the Related Art

A substrate described in, for example, Japanese Unexamined Patent Application Publication No. 2007-305674 is a known substrate with a built-in component. In the following, the substrate with a built-in component described in Japanese Unexamined Patent Application Publication No. 2007-305674 will be described with reference to FIG. 8. FIG. 8 is a cross-sectional view showing the substrate with a built-in component.

A substrate with a built-in component 101 is formed by stacking a plurality of insulating layers 102, which are made of a thermoplastic resin, and by performing thermocompression bonding thereon. Wiring conductors 103, which are made of copper foil or the like, are formed on some of the insulating layers 102. The wiring conductors 103 are electrically connected by vias 104 to lands 105, which are formed on a main surface of the substrate with a built-in component and on the surface opposite the main surface. An electronic component 106 is built in the inside of the substrate with a built-in component 101. Electrodes 106a of the electronic component 106 are electrically connected to the wiring conductors 103 and the lands 105 by the vias 104.

In the case where a plurality of resin sheets composing the substrate are bonded by thermocompression, there is a possibility that wiring conductors and vias are displaced and open defects and short defects occur in such a substrate with a built-in component as a result of the resin flow of a resin sheet in the plane direction or in the thickness direction. A problem has been newly discovered in which the above-described problem occurs more often, particularly in the case where wiring in the periphery of a built-in component is improved to be finer and denser. The resin flow is particularly large in the periphery of the built-in component because the resin in the periphery of the built-in component moves so as to fill the gap between the component and the resin.

SUMMARY OF THE INVENTION

Preferred embodiments of the present invention provide a substrate with a built-in component in which wiring-conductor defects and via defects are prevented and significantly reduced in number, the substrate with a built-in component being obtained as a result by encircling a periphery of the built-in component with a frame-shaped electrode and by suppressing the resin flow occurring in an outer side portion of the frame-shaped electrode in the case of thermocompression bonding.

A substrate with a built-in component according to a preferred embodiment of the present invention includes an insulating base made of a thermoplastic resin and including a pair of main surfaces, an electronic component having a chip shape and built in the inside of the insulating base, a wiring conductor arranged inside the insulating base so as to extend in parallel or substantially parallel to directions in which the main surfaces extend, and a via conductor arranged inside the insulating base, and includes one or more frame-shaped electrodes arranged inside the insulating base so as to encircle the electronic component in a case where the insulating base is viewed from a direction perpendicular or substantially perpendicular to directions in which the main surfaces of the insulating base extend.

The resin flow occurring in an outer side portion of a frame-shaped electrode is suppressed in the case of thermocompression bonding by encircling the periphery of a built-in component with the frame-shaped electrode. As a result, the occurrence of wiring-conductor defects and via defects is significantly reduced and prevented.

Moreover, in the substrate with a built-in component according to a preferred embodiment of the present invention, a frame-shaped electrode is preferably arranged at a position that does not overlap the electronic component in a case where the insulating base is viewed from the directions in which the main surfaces of the insulating base extend.

In this case, the resin flow occurring in an outer side portion of the frame-shaped electrode is suppressed in the case of thermocompression bonding by encircling the periphery of a built-in component with the frame-shaped electrode. As a result, the occurrence of wiring-conductor defects and via defects is significantly reduced and prevented.

Moreover, in the substrate with a built-in component according to a preferred embodiment of the present invention, a frame-shaped electrode is preferably arranged at a position that overlaps at least partially the electronic component in a case where the insulating base is viewed from the directions in which the main surfaces of the insulating base extend.

In this case, the resin flow occurring in the outer side portion of the frame-shaped electrode is suppressed in the case of thermocompression bonding by encircling the periphery of a built-in component with the frame-shaped electrode. As a result, the occurrence of wiring-conductor defects and via defects is significantly reduced and prevented.

Moreover, in the substrate with a built-in component according to a preferred embodiment of the present invention, the wiring conductor and the via conductor are preferably provided in a region of an outer side portion of the region encircled with the frame-shaped electrodes in a case where the insulating base is viewed from a direction perpendicular or substantially perpendicular to the directions in which the main surfaces of the insulating base extend.

In this case, the resin flow occurring in the portion where the wiring conductor and the via conductor are provided is suppressed in the case of thermocompression bonding by providing the wiring conductor and the via conductor in an outer side portion of the frame-shaped electrodes. As a result, the occurrence of wiring-conductor defects and via defects is significantly reduced and prevented.

Moreover, in the substrate with a built-in component according to a preferred embodiment of the present invention, the frame-shaped electrode is preferably connected to the ground electrode.

In this case, the frame-shaped electrode functions as a ground by being connected to the ground electrode. As a result, the frame-shaped electrode can function as an electromagnetic shield.

Moreover, a method for manufacturing a substrate with a built-in component according to a preferred embodiment of the present invention is a method for manufacturing a substrate with a built-in component, the substrate with a built-in component including an insulating base made of a thermoplastic resin and including a pair of main surfaces, an electronic component having a chip shape and built in the inside of the insulating base, a wiring conductor arranged inside the insulating base so as to extend in parallel or substantially parallel to directions in which the main surfaces extend, and a via conductor arranged inside the insulating base, and includes a resin-sheet preparation step of preparing a first resin sheet or more and a plurality of second resin sheets, a conductor forming step of forming the wiring conductor and the via conductor on a predetermined resin sheet among the first resin sheet and the second resin sheets, a frame-shaped electrode forming step of forming one or more frame-shaped electrodes at least on the first resin sheet or the second resin sheets inside the insulating base, a through-hole forming step of forming a through hole arranged to store the electronic component in the first resin sheet, a resin-sheet stacking step of stacking the first resin sheet and the second resin sheets so that two open areas of the through hole are covered with the second resin sheets while the electronic component is stored inside the through hole in a manner in which the frame-shaped electrodes encircle the electronic component in a case where the frame-shaped electrodes are viewed from the stacking direction of the first resin sheet and the second resin sheets, and a thermocompression bonding step of obtaining the insulating base, which is a layered product of resin sheets, by bonding the first resin sheet and the second resin sheets by thermocompression.

In this case, the resin flow occurring in an outer side portion of the frame-shaped electrodes is suppressed in the case of thermocompression bonding by encircling the periphery of a built-in component with the frame-shaped electrodes. As a result, the occurrence of wiring-conductor defects and via defects is significantly reduced and prevented.

Moreover, in the method for manufacturing a substrate with a built-in component according to a preferred embodiment of the present invention, the frame-shaped electrodes preferably include a frame-shaped electrode provided on a surface of the second resin sheets that does not contact the first resin sheet.

In this case, the resin flow occurring in an outer side portion of the frame-shaped electrodes is suppressed in the case of thermocompression bonding by encircling the periphery of a built-in component with the frame-shaped electrodes. As a result, the occurrence of wiring-conductor defects and via defects is significantly reduced and prevented.

Moreover, in the method of manufacturing a substrate with a built-in component according to a preferred embodiment of the present invention, the frame-shaped electrodes preferably include a frame-shaped electrode arranged to contact the first resin sheet.

In this case, the resin flow occurring in an outer side portion of the frame-shaped electrodes is suppressed in the case of thermocompression bonding by encircling the periphery of a built-in component with the frame-shaped electrodes. As a result, the occurrence of wiring-conductor defects and via defects is significantly reduced and prevented.

Moreover, in the method of manufacturing a substrate with a built-in component according to a preferred embodiment of the present invention, the wiring conductor and the via conductor are preferably provided in a region of an outer side portion of a region encircled with the frame-shaped electrodes in a case where the insulating base is viewed from a direction perpendicular or substantially perpendicular to directions in which the main surfaces of the insulating base extend.

In this case, the resin flow occurring in the portion where the wiring conductor and the via conductor are provided is suppressed in the case of thermocompression bonding by providing the wiring conductor and the via conductor in an outer side portion of the frame-shaped electrodes. As a result, the wiring conductor significantly reduces and prevents the occurrence of via defects.

Moreover, in the method of manufacturing a substrate with a built-in component according to a preferred embodiment of the present invention, the conductor forming step and the frame-shaped electrode forming step are preferably performed simultaneously in a single step.

In this case, the productivity increases by performing the conductor forming step and the frame-shaped electrode forming step as a single step.

According to the preferred embodiments of the present invention, the resin flow occurring in an outer side portion of a frame-shaped electrode is suppressed in the case of thermocompression bonding by encircling the periphery of a built-in component with the frame-shaped electrode. As a result, the occurrence of wiring-conductor defects and via defects is significantly reduced and prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
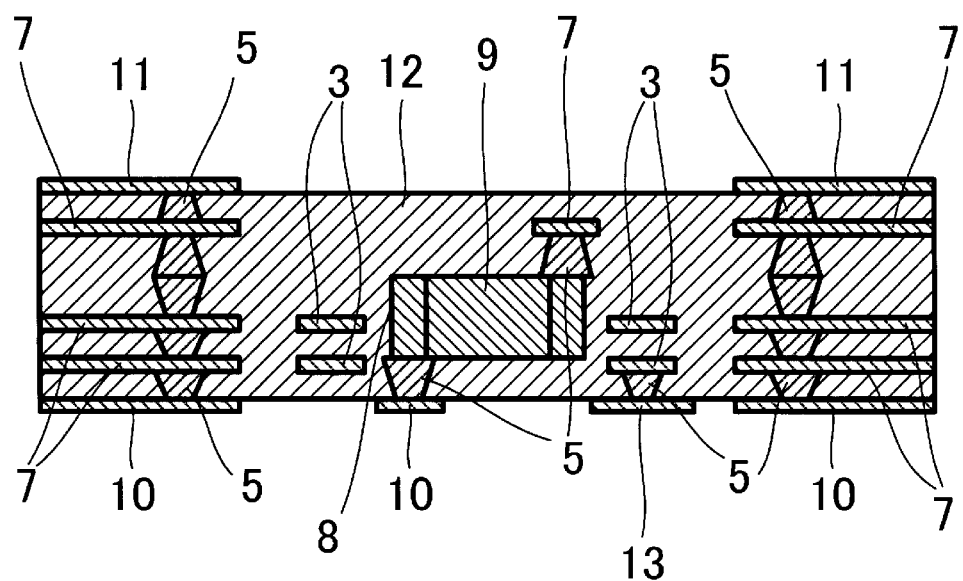
FIG. 1 is a schematic diagram showing a vertical cross-sectional condition of a substrate with a built-in component according to a first preferred embodiment of the present invention.
Figure 2:
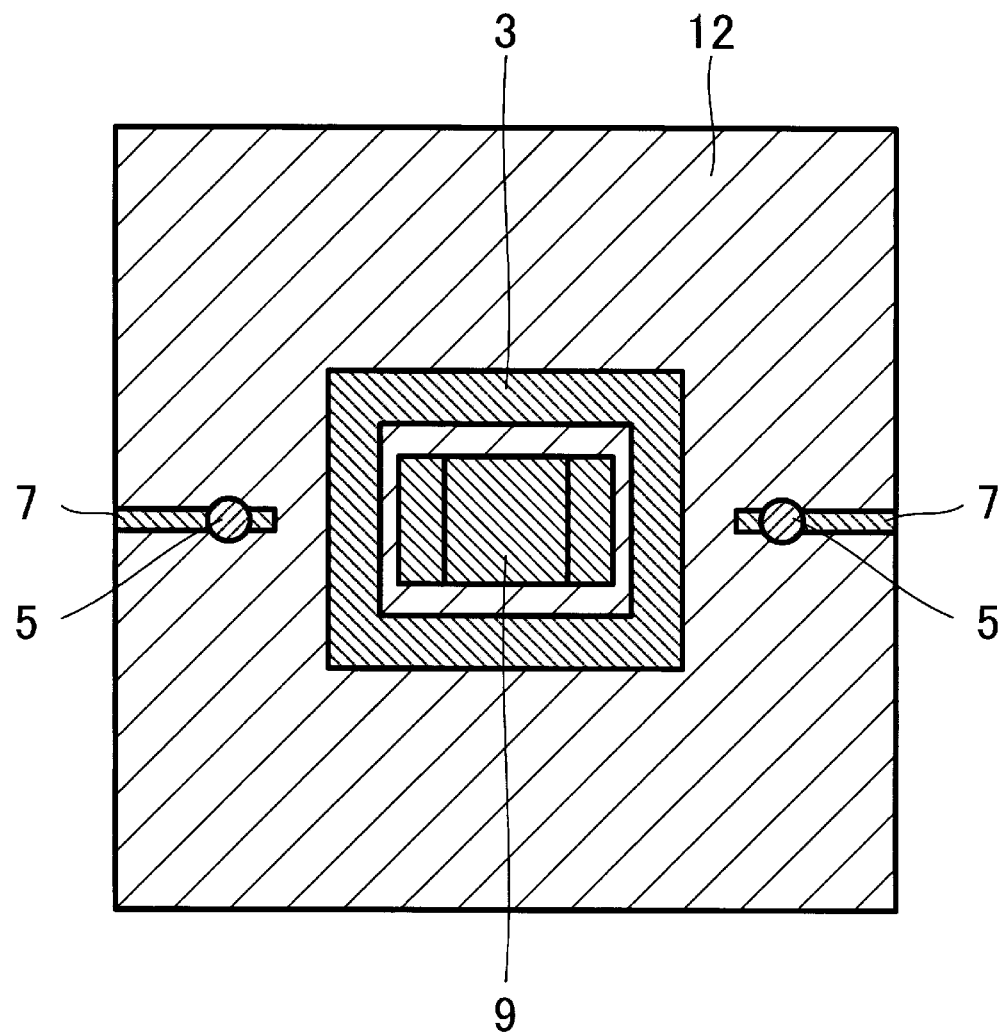
FIG. 2 is a schematic diagram showing a horizontal cross-sectional condition of a substrate with a built-in component according to a preferred embodiment of the present invention.

The following describes a substrate with a built-in component according to a first preferred embodiment of the present invention with reference to FIGS. 1 to 2.

A substrate with a built-in component 20 preferably includes an insulating base 12 made of a thermoplastic resin, the insulating base 12 including vias 5, wiring conductors 7, an electronic component 9, and frame-shaped electrodes 3 in the inside thereof; outer electrodes 10 and a ground electrode 13 arranged on the bottom surface, which is one of main surfaces of the insulating base 12; and electrodes 11 arranged on the top surface of the insulating base 12, which is opposite the bottom surface of the insulating base 12 and the other main surface of the insulating base 12.

The electronic component 9 is preferably, for example, a chip-shaped electronic component, such as, for example, a multilayer chip capacitor defined by forming terminal electrodes at both ends of a layered product in which an internal electrode and a ceramic sheet are stacked.

The insulating base 12 is preferably defined by stacking a predetermined number of resin sheets, which are preferably made of a thermoplastic resin, and by bonding the resin sheets to each other. A cavity 8 is arranged inside the insulating base 12. The electronic component 9 is arranged inside of the cavity 8. (FIG. 1).

The frame-shaped electrodes 3 are preferably arranged in the insulating base 12 between the electronic component 9 and the vias 5 and wiring conductors 7 and encircle the periphery of the electronic component 9 in the case where the insulating base 12 is viewed from the direction perpendicular or substantially perpendicular to directions in which the main surface of the insulating base 12 extends. The frame-shaped electrodes 3 are preferably continuously provided without any gap included therein. That is, the electronic component 9 is preferably completely encircled with the frame-shaped electrodes 3. (FIG. 2).

Moreover, these frame-shaped electrodes 3 are arranged in a region corresponding to the thickness of the electronic component 9 and near this region in the case where the insulating base 12 is viewed from directions in which the main surface of the insulating base 12 extends. That is, the frame-shaped electrodes 3 are arranged at a position that overlaps the electronic component 9 and on a surface that the electronic component 9 contacts in the case where the insulating base 12 is viewed from the directions in which the main surface of the insulating base 12 extends.

Here, two frame-shaped electrodes 3 are shown in FIG. 1; however, the number of the frame-shaped electrodes 3 may alternatively be one or greater than or equal to three, for example.

The flow of the resin of an outer side portion of the frame-shaped electrodes 3 into the peripheral gap between the cavity 8 and the electronic component 9 can be suppressed by providing these frame-shaped electrodes 3 in the case where a plurality of resin sheets are bonded by thermocompression. Therefore, the displacement of the vias 5 and wiring conductors 7 due to the resin flow is less likely to occur in a region of the outer side portion of the frame-shaped electrodes 3. As a result the occurrence of open defects and short defects is significantly reduced and prevented.

The wiring conductors 7 are preferably electrically connected by the vias 5 to the electrodes 11 arranged on the top surface of the insulating base 12 and to the outer electrodes 10 located on the bottom surface of the insulating base 12. Moreover, the electronic component 9 is also preferably electrically connected to the outer electrodes 10 through a via 5. One of the frame-shaped electrodes 3 is electrically connected by a via 5 to the ground electrode 13 arranged on the bottom surface of the insulating base 12. The frame-shaped electrode 3 is allowed to function as an electromagnetic shield by connecting the frame-shaped electrode 3 to the ground electrode 13. (FIG. 1). Here, the ground electrode 13 may be provided inside the insulating base 12.

Next, a non-limiting example of a method of manufacturing a substrate with a built-in component according to a preferred embodiment of the present invention will be described with reference to FIGS. 3 to 5.

Figure 3A:
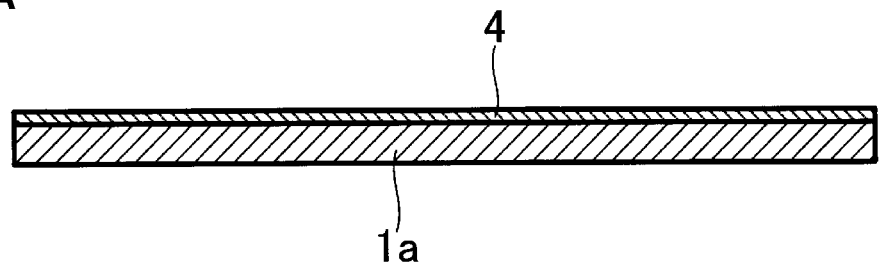
FIGS. 3A-3D include cross-sectional diagrams showing steps for manufacturing a substrate with a built-in component according to a preferred embodiment of the present invention.

First, a resin sheet 1a made of LCP (liquid crystal polymer), which is a thermoplastic resin, is prepared. In addition to LCP, PEEK (polyetheretherketone), PEI (Polyetherimide), PPS (Polyphenylene sulfide), PI (polyimide) and the like are used as a composition material of the resin sheet 1a. This resin sheet 1a includes a conductive foil portion on one surface thereof, the conductive foil portion 4 preferably being made of Cu and having a thickness of about 18 μm. Here, in addition to Cu, the material of the conductive foil portion 4 may alternatively be Ag, Al, SUS, Ni, Au, and alloys made therefrom. Moreover, a conductive foil portion having a thickness of about 18 μm is preferably used in this preferred embodiment; however, the thickness of the conductive foil portion 4 may be about 3 μm to about 40 μm as long as the thickness allows a circuit formation. (FIG. 3A).

Figure 3B:
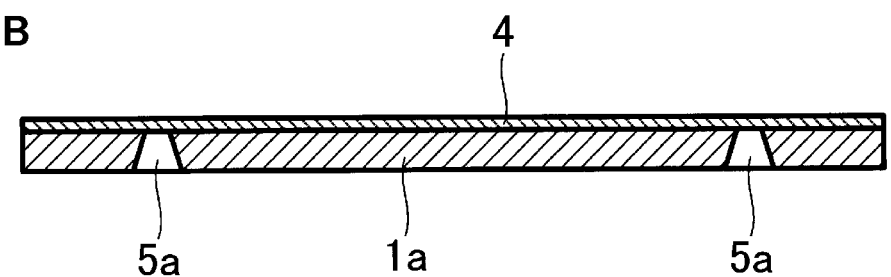

Next, openings 5a for vias are preferably formed by, for example, illuminating the resin-sheet side of the resin sheet 1a with a carbon dioxide gas laser. Subsequently, the residue left in the openings 5a for vias is removed. (FIG. 3B).

Figure 3C:
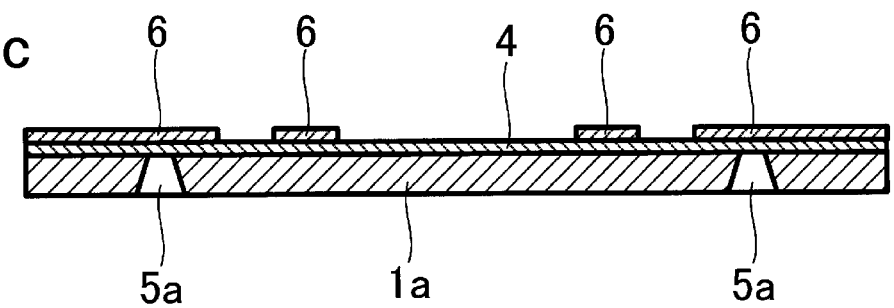

Next, a resist 6 corresponding to a desired circuit pattern is preferably formed by, for example, a general-purpose photolithography on the conductive foil portion 4 of the resin sheet 1a. (FIG. 3C).

Figure 3D:
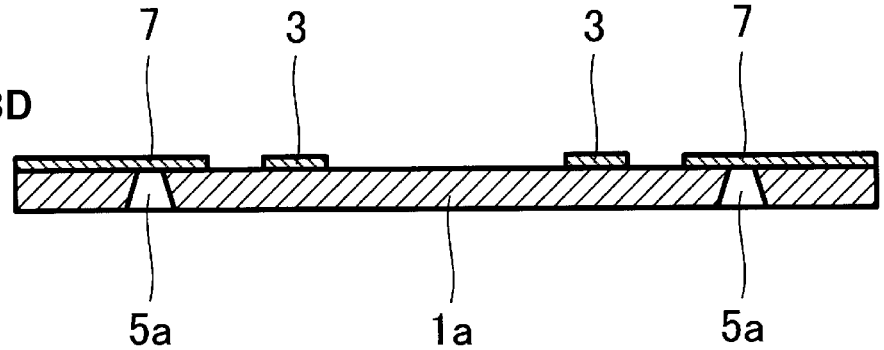

Next, the portion of the conductive foil portion 4 which is not covered by the resist 6 is etched. Subsequently, the frame-shaped electrodes 3 and the wiring conductors 7 are formed by removing the resist 6. These wiring conductors 7 are schematically shown in the figure; however, the wiring conductors 7 are preferably fine wirings arranged in a high-density manner. FIG. 3D.

Figure 4E:
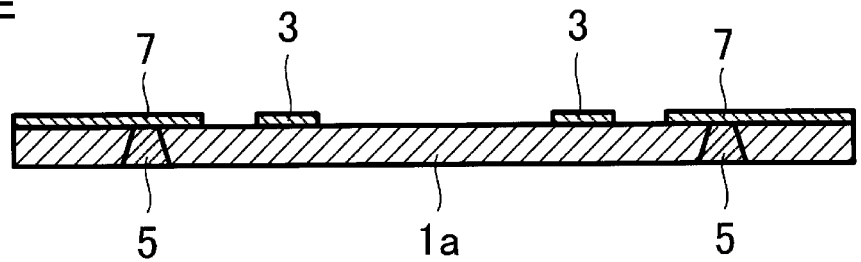
FIGS. 4E-4H include cross-sectional diagrams showing subsequent steps for manufacturing the substrate with a built-in component after FIGS. 3A-3D.

Next, the openings 5a for vias are filled with a conductive paste preferably by, for example, screen printing or the like, and the vias 5 are formed. The conductive paste used in filling preferably includes primarily of Cu. It is preferable to add a proper amount of metal powder to this conductive paste, the metal powder being capable of forming an alloy layer with the conductive metal of the wiring conductors 7 at a temperature at which thermocompression bonding is performed. Since this conductive paste preferably includes primarily of Cu, it is preferable to add at least one of Ag, Cu, and Ni and at least one of Sn, Bi, and Zn as this metal portion. (FIG. 4E).

Next, a through hole 8a is preferably formed by, for example, a punching process, the through hole 8a having an area equal to or larger than that of the electronic component 9 as hereinafter described. As a result, the resin sheet 1a becomes a first resin sheet 1. (FIG. 4F).

Figure 4F:
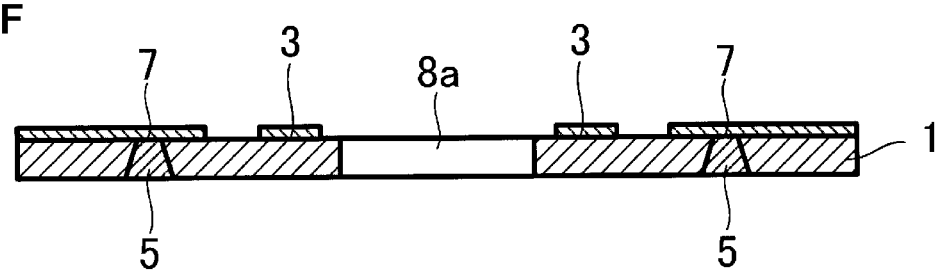
Figure 4G:
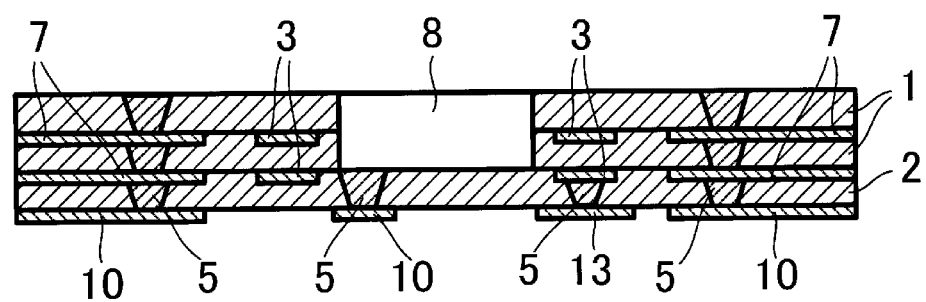

Here, a second resin sheet 2 shown in FIG. 4G is formed by skipping the step of forming the through hole 8a shown in FIG. 4F from the steps for manufacturing the above-described first resin sheet 1.

Next, a predetermined number of first resin sheets 1 and second resin sheets 2 described above will be stacked. First, a second resin sheet 2 is used upside down so that the wiring conductors 7 are to be arranged on the bottom surface of the final substrate with a built-in component. As a result, the wiring conductors 7 arranged on the bottom surface of the final substrate with a built-in component serve as the outer electrodes 10 and the ground electrode 13. Next, two first resin sheets 1 are arranged upside down on the second resin sheet 2. When the arrangement is performed, the first resin sheets 1 are arranged so that the through holes 8a formed on the first resin sheets 1 are superposed with one another and a concave portion is formed in which the electronic component 9 mentioned below is to be inserted. Subsequently, temporary bonding is performed at a temperature (preferably about 150° C. to about 200° C., for example) lower than the below-mentioned temperature for thermocompression bonding. As a result, the through holes 8a of the first resin sheets 1 are superposed with one another and the cavity 8 is formed. (FIG. 4G).

Figure 4H:
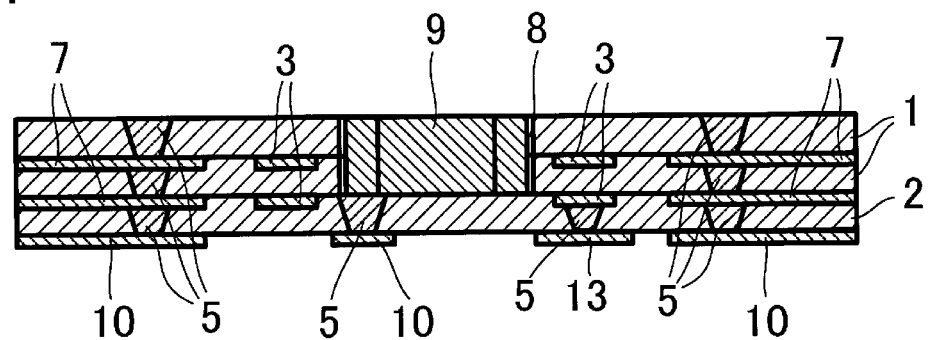

Next, the electronic component 9 is inserted into the cavity 8. (FIG. 4H).

Figure 5I:
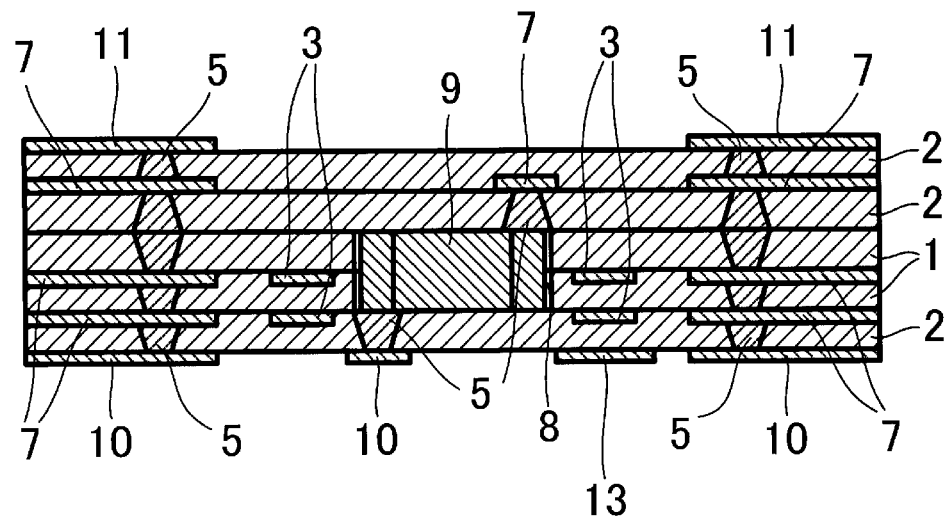
FIGS. 5I and 5J include cross-sectional diagrams showing subsequent steps for manufacturing the substrate with a built-in component after FIG. 4.

Next, another second resin sheet 2 is preferably arranged on the first resin sheets 1 and the electronic component 9. This second resin sheet 2 is arranged so that the wiring conductors 7 provided on the second resin sheet 2 appear on the side opposite the side of the outer electrodes 10 provided on the bottom surface of the final substrate with a built-in component, that is, on the top-surface side of the substrate with a built-in component. Next, another second resin sheet 2 is arranged on this second resin sheet 2. This second resin sheet is arranged so that the wiring conductors 7 arranged on the resin sheet appear on the top-surface side of the substrate with a built-in component. The wiring conductors 7 arranged on the second resin sheet 2 positioned on the top surface of the substrate define the electrodes 11 arranged to mount other IC components and the like. (FIG. 5I).

Next, the first resin sheets 1 and the second resin sheets 2 are preferably bonded by, for example, thermocompression at about 250° C. to about 300° C.

As a result of thermocompression bonding, the insulating base 12 is preferably formed by bonding adjacent resin sheets to each other and the electronic component 9 and the vias 5 are conducted. In the case of thermocompression bonding, the resin in an inner side portion of the frame-shaped electrodes 3 flows into the gap between the cavity 8 and the electronic component 9; however, since the frame-shaped electrodes 3 are provided, the resin in an outer side portion of the frame-shaped electrodes 3 is not affected by the resin flow occurring in the inner side portion of the frame-shaped electrodes 3. That is, the resin flow occurring in the outer side portion of the frame-shaped electrodes 3 is suppressed by the frame-shaped electrodes 3. Therefore, the displacement of the vias 5 and wiring conductors 7 due to the resin flow is less likely to occur. As a result, the occurrence of open defects and short defects is significantly reduced and prevented.

After the thermocompression bonding is performed, a plating process is performed with Ni or Au on the surface of the outer electrodes 10 and the ground electrode 13 formed on the bottom surface of the substrate with a built-in component 20 and on the surface of the electrodes 11 formed on the top surface of the substrate with a built-in component 20. (FIG. 5J).

Figure 5J:
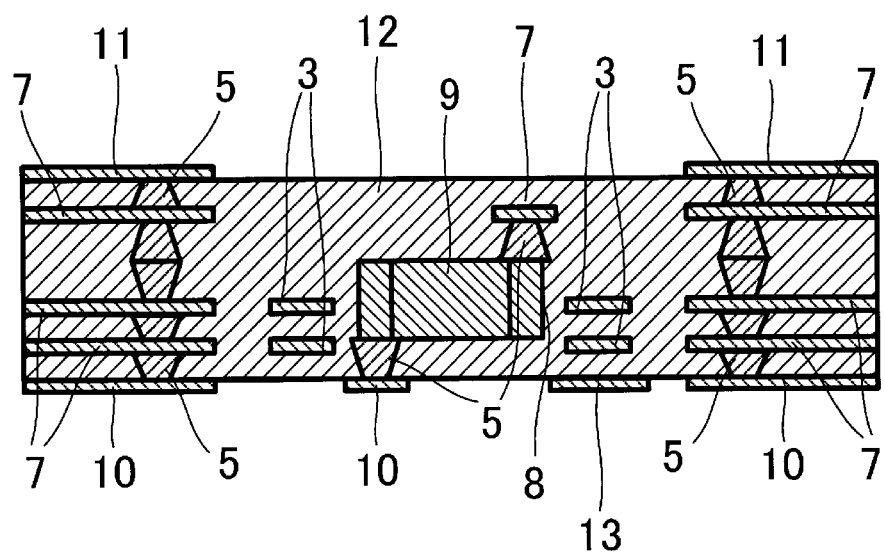

Here, the interfaces between the first resin sheets 1 and the second resin sheets 2, which are stacked, practically disappear in FIG. 5J through the formation of the insulating base 12 by bonding the first resin sheets 1 and the second resin sheets 2 by thermocompression as described above.

Here, the two first resin sheets 1 are preferably stacked in this preferred embodiment, for example. However, the number of the first resin sheets 1 to be used may be changed as appropriate in order to form a cavity into which the electronic component 9 to be built in may be inserted. Moreover, the number of the second resin sheets 2 may also be changed in accordance with a desired substrate. Furthermore, the order in which the first resin sheets 1 and the second resin sheets 2 are stacked may be changed in accordance with a desired substrate.

Second Preferred Embodiment

Figure 6:
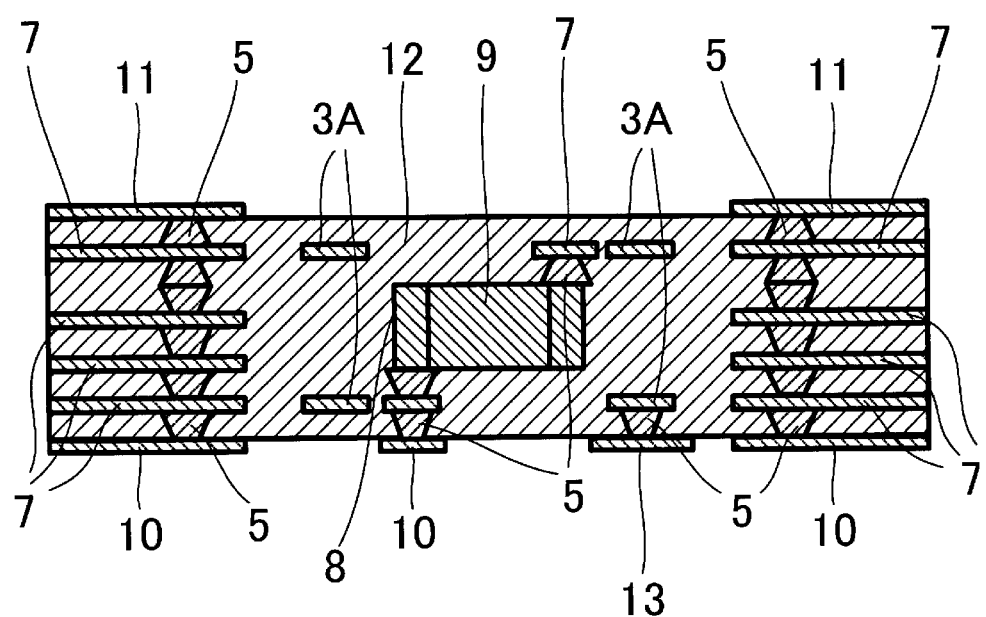
FIG. 6 is a schematic diagram showing a vertical cross-sectional condition of a substrate with a built-in component according to a second preferred embodiment of the present invention.

Next, the second preferred embodiment of the present invention will be described with reference to FIG. 6. Here, components which are the same as those indicated in the first preferred embodiment will be denoted by the same reference numerals, and the description thereof will be omitted.

A substrate with a built-in component 30 according to the second preferred embodiment includes frame-shaped electrodes 3A arranged inside the insulating base 12, similarly to the substrate with a built-in component 20 according to the first preferred embodiment. These frame-shaped electrodes 3A are arranged between the electronic component 9 and the vias 5 and wiring conductors 7 and encircle the periphery of the electronic component 9, similarly to the substrate with a built-in component 20, in the case where the insulating base 12 is viewed from directions in which the main surface of the insulating base 12 extends.

However, the frame-shaped electrodes 3A are preferably arranged at positions that do not overlap the electronic component 9 in the case where the frame-shaped electrodes 3A are viewed from the directions in which the main surface of the insulating base 12 extends. That is, the frame-shaped electrodes 3A are formed in the insulating base 12 at positions above and below the electronic component 9 in the direction in which the layers of the insulating base 12 are stacked. In the insulating base 12 before thermocompression bonding is performed, the frame-shaped electrodes 3A are provided inside the insulating base 12 and on second resin sheets 2 at positions other than the area contacting the electronic component 9.

When the substrate with a built-in component 30 is manufactured, in the case where a plurality of resin sheets are bonded by thermocompression, a greater pressure is applied in the stacking direction than in the plane direction. As a result, the resin flow becomes greater in the stacking direction than in the plane direction. Since the frame-shaped electrodes 3A formed in the substrate with a built-in component 30 are arranged above and below the electronic component 9 in the direction in which the layers of the insulating base 12 are stacked, the resin flow into the gap between the cavity 8 and the electronic component 9 can be further suppressed and the displacement of the vias 5 and wiring conductors 7 is less likely to occur. As a result, the occurrence of open defects and short defects is further reduced and prevented.

Note that the above describes and shows the frame-shaped electrodes 3A in a manner in which one of the frame-shaped electrodes 3A preferably is arranged above the electronic component 9 and the other is arranged below the electronic component 9 in the direction in which the layers of the insulating base 12 are stacked. However, only one of the frame-shaped electrodes 3A above and below may be arranged if so desired. Moreover, a plurality of frame-shaped electrodes 3A may alternatively be arranged only above or below.

Third Preferred Embodiment

Figure 7:
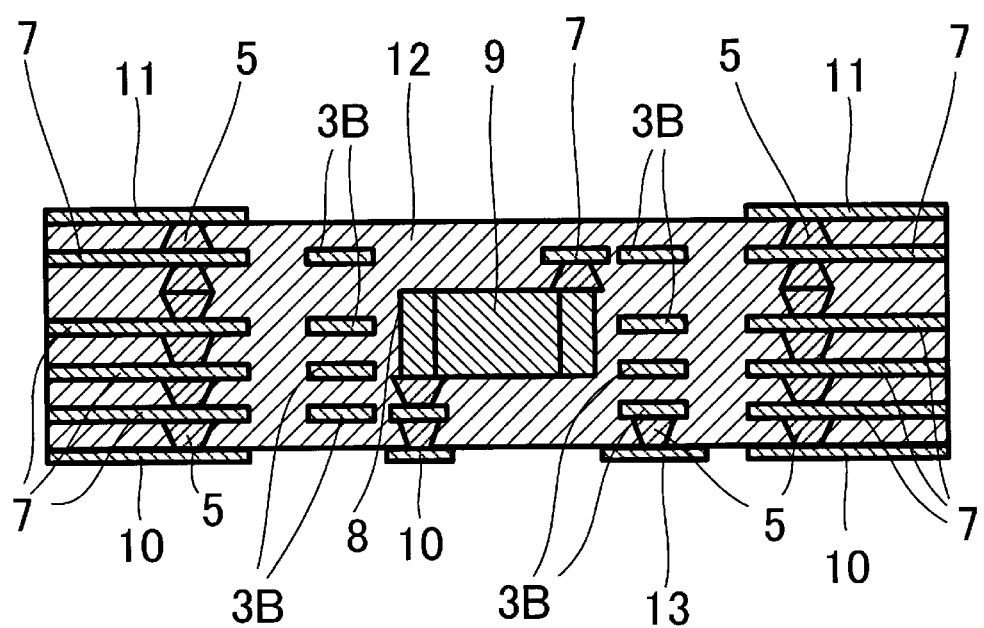
FIG. 7 is a schematic diagram showing a vertical cross-sectional condition of a substrate with a built-in component according to a third preferred embodiment of the present invention.
Figure 8:
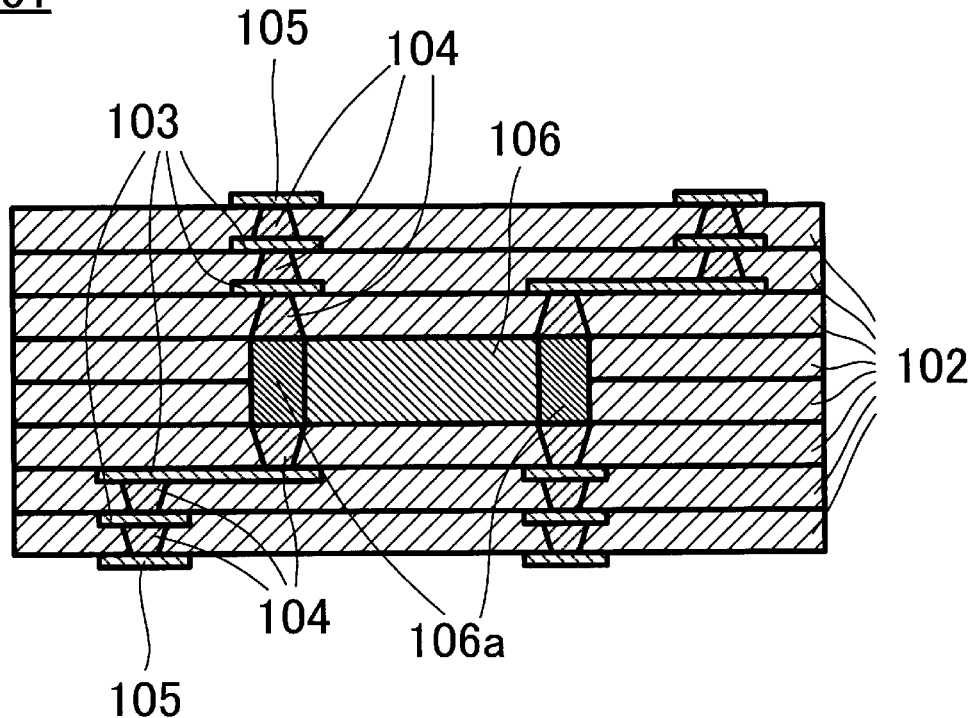
FIG. 8 is a cross-sectional diagram showing the structure of a known substrate with a built-in component.

Next, the third preferred embodiment of the present invention will be described with reference to FIG. 7. Here, components the same as those indicated in the first and second preferred embodiments will be denoted by the same reference numerals, and the description thereof will be omitted.

Frame-shaped electrodes 3B of a substrate with a built-in component 40 according to the third preferred embodiment are also arranged at positions that do not overlap the electronic component 9 inside the insulating base 12 in addition to at the positions corresponding to those of the frame-shaped electrodes 3 according to the first preferred embodiment in the case where the frame-shaped electrodes 3B are viewed from directions in which the main surface of the insulating base 12 extends. That is, in the insulating base 12 before thermocompression bonding is performed, the frame-shaped electrodes 3B include a frame-shaped electrode provided inside the insulating base 12 and on a second resin sheet 2 other than the area contacting the electronic component 9.

In this case, since the resin flow occurring in the stacking direction can be suppressed and the resin flow occurring in the plane direction can also be suppressed, the displacement of the vias 5 and wiring conductors 7 can be further suppressed. As a result the occurrence of open defects and short defects is further reduced and prevented.

Here, examples in which the frame-shaped electrodes 3, 3A and 3B are defined continuously without any gap therein preferably are shown in the above-described preferred embodiments. However, the present invention is not limited thereto. The frame-shaped electrodes 3, 3A, and 3B may alternatively be partially discontinuous if so desired. That is, it is preferable when the frame-shaped electrodes 3, 3A, and 3B have substantially a frame shape.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate with a built-in component, comprising:
   an insulating base made of a thermoplastic resin and including a pair of main surfaces;
   an electronic component arranged inside of the insulating base;
   a wiring conductor arranged inside the insulating base so as to extend in parallel or substantially parallel to directions in which the main surfaces extend; and
   a via conductor arranged inside the insulating base; wherein
   the substrate with the built-in component includes:
   one or more frame-shaped electrodes arranged inside the insulating base so as to encircle the electronic component when the insulating base is viewed from a direction perpendicular or substantially perpendicular to directions in which the main surfaces of the insulating base extend;
   the one or more frame-shaped electrodes are not connected to the electronic component;
   each of the one or more frame-shaped electrodes is a closed frame-shaped electrode this is continuously provided without any gap included therein; and
   the electronic component is completely encircled by at least one of the one or more frame-shaped electrodes.

2. The substrate with a built-in component according to claim 1, wherein the one or more frame-shaped electrodes include a frame-shaped electrode arranged at a position that does not overlap the electronic component when the insulating base is viewed from the directions in which the main surfaces of the insulating base extend.

3. The substrate with a built-in component according to claim 1, wherein the one or more frame-shaped electrodes include a frame-shaped electrode arranged at a position that overlaps at least partially the electronic component when the insulating base is viewed from the directions in which the main surfaces of the insulating base extend.

4. The substrate with a built-in component according to claim 1, wherein the wiring conductor and the via conductor are provided in a region of an outer side portion of the region encircled with the frame-shaped electrodes when the insulating base is viewed from a direction perpendicular or substantially perpendicular to the directions in which the main surfaces of the insulating base extend.

5. The substrate with a built-in component according to claim 1, further comprising:
   a ground electrode arranged inside the insulating base or on at least one of the pair of the main surfaces of the insulating base; wherein
   the one or more frame-shaped electrodes are connected to the ground electrode.

6. The substrate with a built-in component according to claim 1, wherein the one or more frame-shaped electrodes include two frame-shaped electrodes arranged to overlap one another when the insulating base is viewed from the direction perpendicular or substantially perpendicular to the directions in which the main surfaces of the insulating base extend.

7. The substrate with a built-in component according to claim 1, wherein the one or more frame-shaped electrodes are made of one of Cu, Ag, Al, SUS, Ni, Au, and alloys thereof.

8. The substrate with a built-in component according to claim 1, wherein the one or more frame-shaped electrodes are arranged both above and below the electronic component when the insulating base is viewed from the direction perpendicular or substantially perpendicular to the directions in which the main surfaces of the insulating base extend.

* * * * *